United States Patent [19]
Sato

[11] Patent Number: 5,386,131
[45] Date of Patent: Jan. 31, 1995

[54] SEMICONDUCTOR MEMORY DEVICE

[75] Inventor: Natsuki Sato, Tokyo, Japan

[73] Assignee: NEC Corporation, Tokyo, Japan

[21] Appl. No.: 944,241

[22] Filed: Sep. 14, 1992

[30] Foreign Application Priority Data

Sep. 13, 1991 [JP] Japan .................. 3-262839

[51] Int. Cl.$^6$ ............... H01L 29/68; H01L 29/78; H01L 29/92
[52] U.S. Cl. .................. 257/301; 257/296; 257/300; 257/303; 257/305; 257/306
[58] Field of Search ............ 257/296, 300, 301, 303, 257/306, 305

[56] References Cited

U.S. PATENT DOCUMENTS

| | | | |
|---|---|---|---|
| 4,752,819 | 6/1988 | Koyama | 357/41 |
| 4,803,535 | 2/1989 | Taguchi | 257/301 |
| 4,920,390 | 4/1990 | Fuse et al. | 257/301 |
| 4,922,313 | 5/1990 | Tsuchiya | 357/23.6 |
| 5,027,172 | 6/1991 | Jeon | 257/303 |
| 5,065,215 | 11/1991 | Kubota | 357/45 |
| 5,066,609 | 11/1991 | Yamamoto et al. | 437/52 |
| 5,111,259 | 5/1992 | Teng et al. | 357/23.6 |
| 5,136,533 | 8/1992 | Harari | 365/149 |

FOREIGN PATENT DOCUMENTS

59-191373 10/1984 Japan .
60-126861 7/1985 Japan .
4-65872 3/1992 Japan .

*Primary Examiner*—Sara W. Crane
*Assistant Examiner*—Valencia M. Wallace
*Attorney, Agent, or Firm*—Burns, Doane, Swecker & Mathis

[57] ABSTRACT

A DRAM having memory cells each consisting of a MOS transistor and a trench-stack capacitor built at a p-type silicon substrate. The MOS transistor comprises a source region made of the first diffused n$^-$ layer, and a drain region composed of the first diffused n$^-$ layer and the first diffused n$^+$ layer self-aligned with respect to a bit contact hole. At the surface of the p-type silicon substrate is formed a trench penetrating through the source region near the gate electrode of the MOS transistor working also as a word line. The capacitor is built to extend deep into a U-shaped section. The second diffused n$^-$ layer is formed at the the trench sidewall surface of the p-type silicon substrate, and the second insulating film is formed over the sidewall of the trench. The second diffused n$^+$ layer is formed at the trench bottom surface of the p-type silicon substrate. The bottom face of the trench functions as a node contact hole of the memory cell. The storage node electrode of the trench-stacked capacitor is electrically connected through the node contact hole, the second diffused n$^+$ layer and the second diffused n$^-$ layer to the source region. The structure mentioned above has not only the same effects as the conventional trench-stacked capacitor DRAM over the trench capacitor DRAM but also an effect of less memory cell space than the conventional trench-stacked capacitor DRAM.

3 Claims, 7 Drawing Sheets

SEMICONDUCTOR MEMORY DEVICE

BACKGROUND OF THE INVENTION

1. Field of the Invention

This invention relates to a semiconductor memory device, and more particularly to a DRAM with memory cells each consisting of a MOS transistor and a trench-stacked capacitor in which information is stored.

2. Description of the Prior Art

In early DRAMs of the one-MOS transistor/one-capacitor type, planar capacitors were used. For the purpose of reducing memory cell space compared with planar capacitor DRAMs, trench capacitor DRAMs have appeared.

General structure of trench capacitor memory cells comprises a n-channel MOS transistor and a trench capacitor at a p-type silicon substrate. The MOS transistor consists of a gate electrode serving also as word line, a gate oxide film, and source and drain regions of the first n− layer. The drain region is connected to a bit line through bit contact hole. The trench capacitor is built in a trench at the surface of p-type silicon substrate by forming the second diffused n− layer to be a storage node electrode on the exposed surface (trench wall) of the p-type silicon substrate, a dielectric film placed thereover, and a cell plate electrode formed over the dielectric film. At the upper end of the trench, the source region is contiguous to the second diffused n− layer. Separation between the elements of the adjacent memory cells is achieved by a p+-channel stopper region (herein the "p+" represents higher p-type impurity concentration than that of the p-type silicon substrate) and field oxide film.

In this structure, there is a junction between the p+-channel stopper region and the second diffused n+ layer of the trench capacitor, and the current leakage across the junction presents problem with degradation of the stored-information retentivity.

There are methods for preventing junction leakage, for example, by forming a diffused n− layer as the storage node electrode, and by using the p-type silicon substrate itself as storage node electrode. For example, when a memory cell drive supply voltage of 5 V is used (referred to as 5 V-supply, hereinafter), the cell plate is supplied with 2.5 V. The information-write bit line of the memory cell is supplied with 5 V. For example, assuming the MOS transistor of the memory cell to have a threshold voltage of 1.0 V, the storage node electrode is raised to about 4 V for the information write. With these methods, therefore, spacings up to 0.8 μm between the adjacent trench capacitors result in occurrence of a depletion layer from the storage node electrodes, and in turn induction of punchthrough between the neighboring trench capacitors. This causes another problem of difficult retention of stored information. To 5 V-supplied trench capacitor DRAMs, therefore, the width of the separation region between the adjacent elements (referred to as element separating region, hereinafter) is an impeding factor against microminiaturization. A further problem is associated with becoming liable to produce soft error due to α-particles. Besides even if the spacing between elements is great enough to impede occurrence of punchthrough, the occurrence of depletion layer from the information-storage node electrode leads to reduction of effective capacitance of the capacitor.

For example, Japanese Laid-open Patent Application No. Sho.59-191,373 discloses a trench-stacked capacitor DRAM for solving the problem of the punchthrough phenomenon associated with trench capacitor DRAMs. The trench-stacked capacitor memory cell described in this patent specification is constructed of a n-channel MOS transistor and a trench-stacked capacitor built at the surface of a p-type silicon substrate. The MOS transistor of which the structure is almost the same as the MOS transistor of the trench capacitor DRAM. The trench-stacked capacitor extends deep into a U-shaped trench formed at the p-type silicon substrate, and the surface of it is covered with an insulting film. It is a structure consisting of a storage node electrode, a dielectric film, and a cell plate electrode stacked, the succeeding over the surface of the preceding. The storage node electrode is connected to a source region through a node contact hole reaching the top face of the source region. The structure according to this patent specification is accompanied by no occurrence of punchthrough between capacitors due to the depletion layer from storage node electrode, which cancels restriction to the separation spacing between elements, and effects microminiaturization.

In addition it is disclosed in Japanese Laid-Open Application No.Sho.60-126861 that a diffused p+ layer is provided at the exposed surface of a p-type silicon substrate as the result of forming a V-shaped trench at this substrate, and thereby reliable prevention of punchthrough occurrence between capacitors is obtainable.

The above discussion is true of preventing punchthrough between capacitors in the 5 V-supplied DRAM but not referred to the MOS transistor of the memory cell. A proposal of reducing junction leakage between the p+-channel stopper region of the element-separating region junction and the source and drain regions of the MOS transistor was made, and brings about a tendency to produce punchthrough between the adjacent MOS transistors.

With microminiaturization of DRAMs, lower supply voltage is used. For example, using 0.6 μm feature design rules, memory cell drive supply voltage is 3.3 V. Correspondingly 1.65 V is applied to the cell plate electrode and 5 V to the information-write bit line of the memory cell. For example, assuming the threshold voltage of the memory-cell MOS transistor to be 1.0 V, the storage node electrode is supplied with about 2.3 V by the information writing. Building of trench capacitor DRAM using this design rules enables to prevent punchthrough between the adjacent trench capacitors due to occurrence of depletion layer from the storage node electrode, only if the spacing between the adjacent trench capacitors is about 0.4 μm (for example, the element separating region has a minimum width of 0.6 μm). It however is impossible to reduce the effective capacitance of the capacitor due to the occurrence of depletion layer from the information-stored node electrode.

In the trench-stacked capacitor DRAM, a node contact hole is required for connection between the storage node electrode and the source electrode. The existence of node contact hole like this in the trench-stacked capacitor DRAM becomes larger barrier with microminiaturization of DRAM against reduction of memory cell space.

BRIEF SUMMARY OF THE INVENTION

It is an object of the present invention to provide a trench-stacked capacitor DRAM.

Another object of the present invention is to provide a trench-stacked capacitor DRAM adapted for microminiaturization.

A further object of the present invention is to provide a trench-stacked capacitor DRAM capable to prevent punchthrough from occurring between memory cells, and adapted for lessening the memory cell space.

A further object of the present invention is to provide a trench-stacked capacitor DRAM allowing hardly any p-n junction leakage between memory cell elements and channel stopper regions to occur, having good retentivity of stored information, and being adapted for microminiaturization.

A semiconductor memory device according to the present invention comprises a plurality of memory cell each consisting of a MOS transistor built at a p-type silicon substrate and a trench-stacked capacitor extending on the sidewall of, and deep into, a U-shaped trench formed at the p-type silicon substrate; a pair of the memory cells consisting of two MOS transistors and two trench-stacked capacitors being formed within an element region defined by element separating regions, each element separating region consisting of a $p^+$-channel stopper region on the surface of the p-type silicon substrate and a field oxide film formed on, and self-aligned with, the $p^+$-channel stopper region; the MOS transistor consisting of a gate electrode working also as a word line, a gate oxide film, a source region of a first diffused $n^-$ layer, and a drain layer consisting of a first diffused $n^-$ layer and a first diffused $n^+$ layer, the drain region being connected through a bit contact hole to the bit line, and the surface of the MOS transistor being covered with a first insulating film; the U-shaped trench penetrating through the first insulating film and the source region, a second diffused $n^-$ layer formed at the surface of the p-type silicon substrate exposed as the sidewall of the trench, a second insulating film formed over the sidewall of the trench, and a second diffused $n^+$ layer being formed at the surface of the p-type silicon substrate exposed at the bottom of the trench; and the trench-stacked capacitor consisting of a storage node electrode formed to extend over the surface of the trench and connected, making use of the bottom of the trench as the node contact hole, to the second diffused $n^+$ layer, a dielectric film formed over the storage node electrode, and a cell plate electrode formed over the dielectric film.

The storage node electrode is made preferably of a $n^+$ polycrystalline silicon film. Also it is preferable that the MOS transistor includes a spacer made of the first insulating film on the near side face of the gate electrode to the source region, and the trench is self-aligned with respect to the spacer and the field oxide film.

In the DRAM memory cell according to the present invention, diffused $n^-$ layers which contacts directly with a $p^+$-channel stopper region are the first and second diffused $n^-$ layers, and thereby junction leakage becomes lowered. Different from the conventional trench capacitor with diffused $n^-$ layer as storage node electrode, the storage node electrode of the trench-stacked capacitor of DRAM memory cell according to the invention can be made as of $n^+$ type polycrystalline silicon film, and this can prevent reduction of the effective capacity of the capacitor due to the depletion from the storage node electrode on which information becomes stored. In this case, a larger depletion layer occurs in the second diffused $n^-$ layer occurs which exerts no direct influence on capacitor because of the presence of the second insulating film. In the construction according the present invention, if it is possible to prevent punchthrough memory cell MOS transistors, also punchthrough between capacitors can be prevented. Besides the construction according to the present invention of providing a node contact hole on the bottom face of the trench leads to less memory cell space than that of the conventional trench-stacked capacitor DRAM, and thus is effective on microminiaturization of semiconductor devices, especially on submicron feature design rules DRAMs to which low drive supply voltages are applied.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
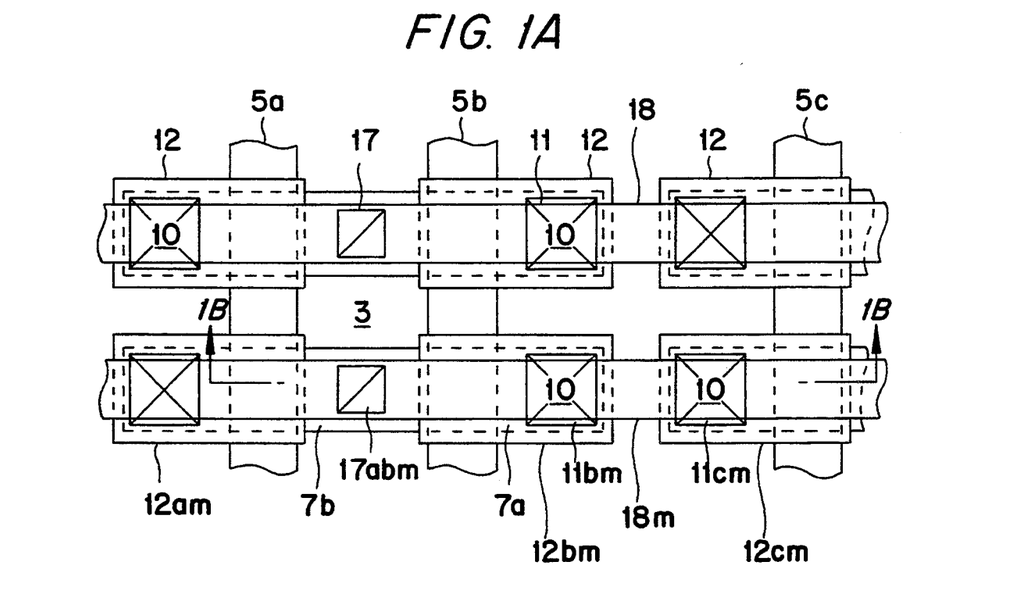
FIG. 1A is a plan view of the first embodiment of the present invention.
Figure 1B:
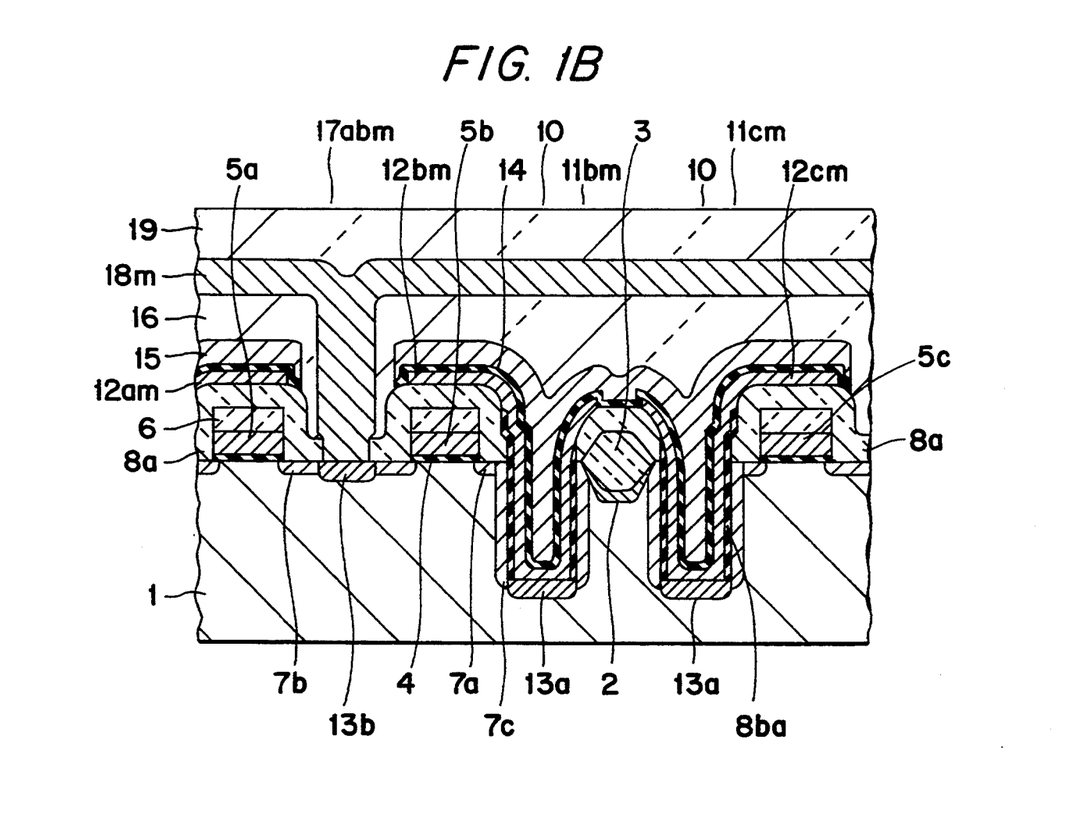
FIG. 1B is a cross-sectional view taken along line A—A of FIG. 1A.

The present invention will be described with reference to the accompanying drawings hereinafter:

Reference is made to FIG. 1A, a plan of a plurality of DRAM memory cells, and FIG. 1B, a cross-section taken along line A—A of FIG. 1A, for setting forth the first embodiment of the present invention. Each memory cell consists of a MOS transistor and a trench-stacked capacitor. The DRAM is an open-bit-line arrangement of a plurality of memory cells where element regions are disposed at intersections of word lines $5a$, $5b$, $5c$, etc. and bit lines 18, $18m$, etc.

For this DRAM are used 0.6 $\mu$m feature design rule, a minimum feature size of 0.4 $\mu$m, and a mask alignment accuracy of 0.05 $\mu$m. The parallel lengths of the memory cell to the word and bit lines are 2.35 $\mu$m and 1.3 $\mu$m, respectively. It follows that the memory cell space (cell size) is 3.055 $\mu$m$^2$.

On the surface of a p-type silicon substrate 1 is formed a $p^+$-channel stopper region 2, and thereon a self-aligned field oxide film 3 is formed, these making up a element separating region. An element region defined by such separation regions includes a pair of memory cells consisting of two MOS transistors and two trench-stacked capacitors, these being covered with a goodreflow dielectric film 16 made from PSG or BPSG. Minimum width of the element separating region amounts 0.6 μm and minimum width of the element region to 0.7 μm.

Word lines 5a, 5b, 5c are made of n+-type polycrystalline silicon film of 0.2 μm thick and 0.6 μm wide, on which a 0.2 μm-thick silicon oxide film 6 is placed. The interval between word lines 5a, 5b is 1.1 μm. Word lines may be made of high melting-point metal or metal silicide film. Bit lines 18, 18m running on dielectric film 16 are made as of aluminium film, and have a width of 0.5 μm. The interval between them amounts to 0.8 μm. Over the whole surface of dielectric film 16 including bit lines 18, 18m is placed a surface protecting film 19.

Each MOS transistor consists of a gate electrode which is also word line 5a, 5b or 5c, a gate oxide film 4 of 10 to 15 nm thick, a source region of the first diffused n− layer 7a, and a drain region made up of the first diffused n− layer 7b and the first diffused n+ layer 13b. The first diffused n− layers 7a, 7b have an about 0.2 μm deep junction. The MOS transistors including the above-mentioned oxide film 6 are covered with a 200 nm thick silicon oxide film 8a that is the first insulating film. There are provided bit contact holes 17, 17a b m, etc., each penetrating through dielectric film 16 and silicon oxide film 8a to the MOS transistor drain region. Bit lines 18, 18m are connected through bit contact holes 17, 17a b m to respective drain regions. Bit contact holes 17, 17a b m has a section of 0.4 μm square except the portion penetrating through dielectric film 16 somewhat larger in section. The first diffused n+ layer 13b of the drain region is self-aligned to bit contact hole 17, 17a b m. The first diffused n− layers 7a, 7b are directly adjacent to p+-channel stopper region 2 but the first diffused n+ layer 13b is not so.

There are formed at the surface of p-type silicon substrate 1 U-shaped trenches 10 each, about 3 μm deep, 0.6 μm square in section, penetrating through silicon oxide film 8a and the first diffused n− layer 7a (source region). The spacing is is 0.25 μm from trench 10 and word line and 0.05 μm (equal to the mask alignment accuracy) to field oxide film 3. At the exposed surface of the p-type silicon substrate as the sidewall of the trench, the second diffused n− layer 7c is formed, and thereover a silicon oxide film 8b a of 20–50 nm thick is formed as the second insulating film. The second diffused n− layer 7c has a 0.1 μm deep junction. Silicon oxide film 8b functions as a spacer of trench 10. Self-aligned with the silicon oxide film 8b a is formed the node contact hole 11, 11b m or 11c penetrating to the bottom of the trench 10. Besides self-aligned with node contact hole 11, 11b m or 11c at the exposed surface of p-type silicon substrate 10 at the bottom of the trench is formed second diffused n+ layer 13a which is electrically connected through the second diffused n− layer 7c to the first diffused n− layer 7a.

The above-mentioned trench-stacked capacitors are built in the form of extending deep into trench 10, and each consists of a 100 nm-thick storage node electrode 12, 12a m, 12b m or 12c m made of n+ polycrystalline silicon film, a dielectric film 14 of 1.5 to 2.0 nm, assuming as silicon oxide film, and a 200 nm-thick cell plate electrode 15 made of n+ polycrystalline silicon film. The storage node electrode 12 extends down through node contact hole 10 on opposite side of silicon oxide film 8b a to, and over, the sidewall of trench 10, and on reaching the bottom of the trench 10, is placed in contact with the second diffused n+ layer 13a. It also extends up through silicon oxide film 8a until it reaches above field oxide film 3 and the word line. The interval between storage node electrodes 12 amounts of 0.4 μm which is the minimum feature size.

There is provided over the bottom of each trench 10 a node contact hole 11 which connects between storage node electrode 12 of the trench-stacked capacitor and the source region of the MOS transistor as described above. Thereby in the first embodiment of trench-stacked capacitor DRAM each memory cell space is reduced by at least the area of the node contact hole 11 (0.6 μm square) compared with that in the conventional similar-type DRAM. Besides the second diffused n+ layer 13a (and the first diffused $n^{30}$ layer 13b) is not placed in direct contact with p-channel stopper region 2, thereby the information-retentivity lowering due to junction leakage is reduced. In addition, when the minimum width of the element separating region is 0.6 μm mentioned above at a memory cell drive supply volt of 3.3 V, it is possible to prevent punchthrough between the second diffused n− layers 7c formed at each trench 10 because of the interval of 0.5 μm or more between them. Furthermore when information is stored on the capacitor, the depletion layer spreads from the second diffused n− layer 7c, but no effective lowering of the capacity of the capacitor occurs because of the presence of silicon oxide film 8b a and because of a slight spread of the depletion layer from storage node electrode 12 of the capacitor, the slight spread being due to n+ polycrystalline silicon film making up the storage node electrode 12. In other words, the capacitance of the capacitor is directly unaffected by the spread of the depletion layer from the second diffused n− layer 7c.

Referring to FIGS. 2A to 2F which are similar cross-sections, a process of manufacturing the DRAM of the first embodiment will be described below. The DRAM memory cell is made as follows: (The peripheral circuitry comprising CMOS transistors are made in conjunction with formation of memory cells, but will not referred to the process of fabricating it.

On the surface of a p-type silicon substrate 1 of $1 \times 10^{16}$ to $1 \times 10^{17}$ cm$^{-3}$ in impurity concentration are formed element separating regions each consisting of a $p^{30}$-channel stopper and a LOCOS field oxide film 3. A gate oxide film 4 of 10 to 15 nm thick is formed within an element area defined by element separating regions. Over the entire surface, a 0.2 μm thick n+ polycrystalline silicon and a 0.2 μm-thick silicon oxide film 6 are formed. Then by the known photolithography technique, the silicon oxide film 6 and n+ polycrystalline silicon film are in sequence etched to form word lines 5a, 5b, 5c, etc. At this time silicon oxide film 6 leaves on the word lines. Subsequently ion injection of phosphorous at a dose of $5 \times 10^{13}$ cm$^2$ is performed using silicon oxide films 6 and word lines 5a, 5b, 5c, etc. to form the first diffused n− layers 7a, 7b defined by the junction appearing at a final depth about 0.2 μm. Over the whole resulting surface is formed a 200 nm-thick silicon oxide film 8a made of the first insulating film, and thereon a photoresist film 9a having openings at locations where trenches are to be formed is placed. Using this photoresist film 9a as mask, silicon oxide film 8a is etched off [FIG. 2A].

In the next step, after removing photoresist film 9a, p-type silicon substrate 1 is etched using silicon oxide film 8a as mask by the known RIE method to form trenches 10 of 3 μm deep and 0.6 μm square. Then ion implantation of arsenic at a dose of $5 \times 10^{14}$ cm$^{-2}$ using rotating and planetary substrate holders is conducted to form the second diffused n⁻ layer 7c at the side wall of each trench 10 with appearance of a junction at a final depth of at most 0.1 μm [FIGS. 1A and 2B].

Figure 2A:
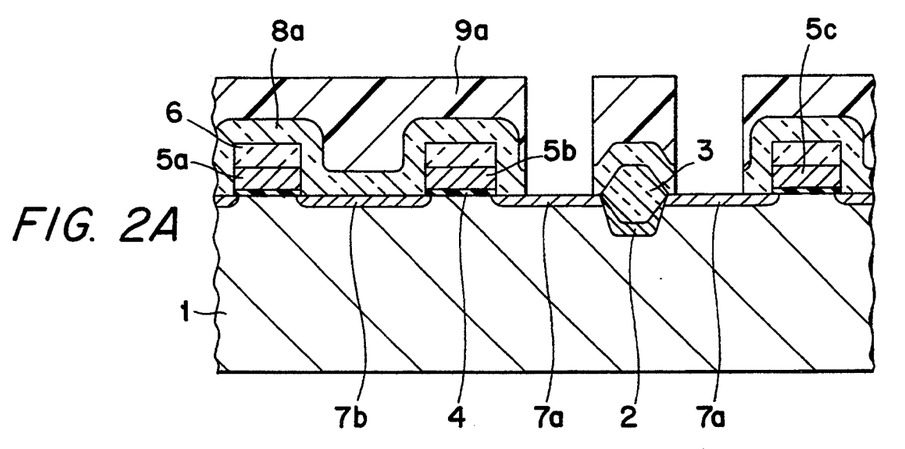
FIGS. 2A to 2F are similar cross-sectional views illustrating the manufacturing process of the first embodiment.
Figure 2B:
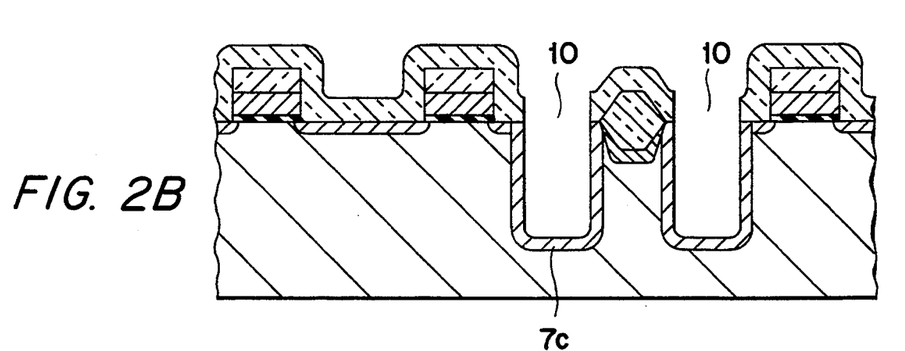
Figure 2C:
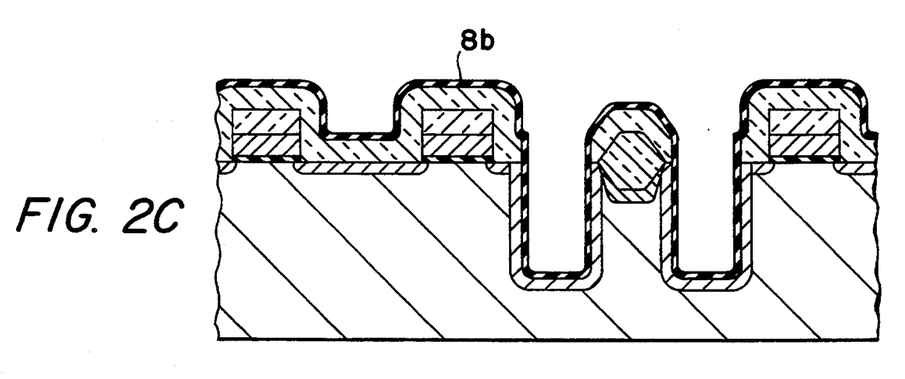
Figure 2D:
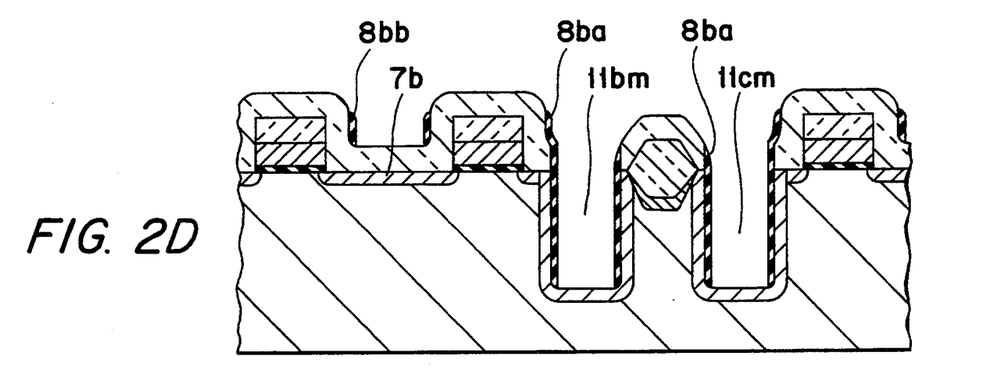
Figure 2E:
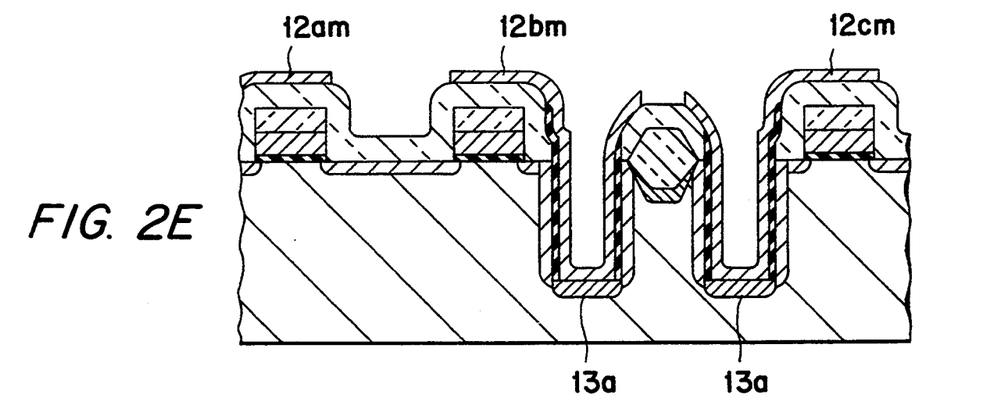
Figure 2F:
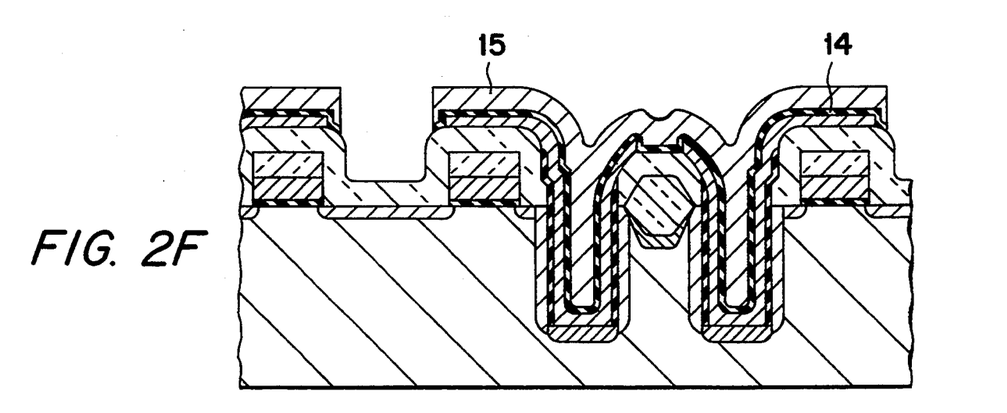

In the next step, over the entire surface is formed the second insulating film of 20 to 50 nm thick as silicon oxide film 8b [FIG. 2C] which is etched back by anisotropic etching, leaving portions of it as spacers over the sidewall of trench 10. As another result, a node contact hole 11, 11b m, 11c m, etc. are formed on the bottom of each trench. In addition, silicon oxide film 8b b stays on the side face of silicon oxide film 8a just above each first diffused n⁻ layer 7b (drain region) [FIGS. 1A, 2D].

In the next step, over the entire surface, a 100 nm-thick n⁺ polycrystalline silicon film is formed and patterned by a known photolithography technique to form storage node electrodes 12, 12a m, 12b m, 12c m, etc. Simultaneously silicon oxide films 8b b are removed. These storage node electrodes are subjected to thermal treatment to diffuse n-type impurity from them, resulting in forming the second diffused n⁺ layer 13a at the bottom of each trench 10 [FIGS. 1A, 2E]. Besides instead the second n³⁰ diff lauseduyer may be formed by ion implantation of arsenic at a dose of about $5 \times 10^{15}$ cm⁻², followed by thermal treatment after forming storage node electrodes made of tungsten film or tungsten silicide film.

In the next step, on the surfaces of at least storage node electrodes 12, 12a m, 12b m, 12c m, etc. a dielectric film 14 of 1.5 to 2.0 nm-thick, assuming as silicon oxide film, and thereover a 200 nm-thick n⁺ polycrystalline silicon film are formed. These are patterned by the known photolithography technique to form dielectric film 14 and cell plate electrode 15 [FIG. 2F]. The dielectric film is a stacked film of a silicon oxide film, silicon nitride film and silicon oxide film, or it may be a tantalum oxide film. The cell plate electrode is not limited to n⁺ polycrystalline silicon film but any high melting point metal or alloy film may be used for it.

In the next step, over the entire surface, a film as of BPSG is deposited, followed by relfow treatment, to form a dielectric film 16. Then dielectric film 16 and silicon oxide film 8a are sequentially etched to form bit contact holes 17, 17a b m, etc., reaching the first diffused n⁻ layer 7b. Bit contact holes 17, 17a b m, etc. have a section of 0.4 μm square at silicon oxide film 8a and a larger section at dielectric film 16. This is because of making use of different etching rates between silicon oxide film 8a and dielectric film 16. Then ion implantation of phosphorus is carried out at a dose of $5 \times 10^{15}$ to $1 \times 10^{16}$ cm⁻² using dielectric layer 16 as masks, followed by thermal treatment, to form the first diffused n⁺ layers 13b self-aligned with bit contact holes 17, 17a b m, etc., respectively. Then bit lines as of aluminum are deposited using the known technique. Finally over the whole surface, a surface protecting film 19 is formed [FIGS. 1A and 1B].

Figure 3A:
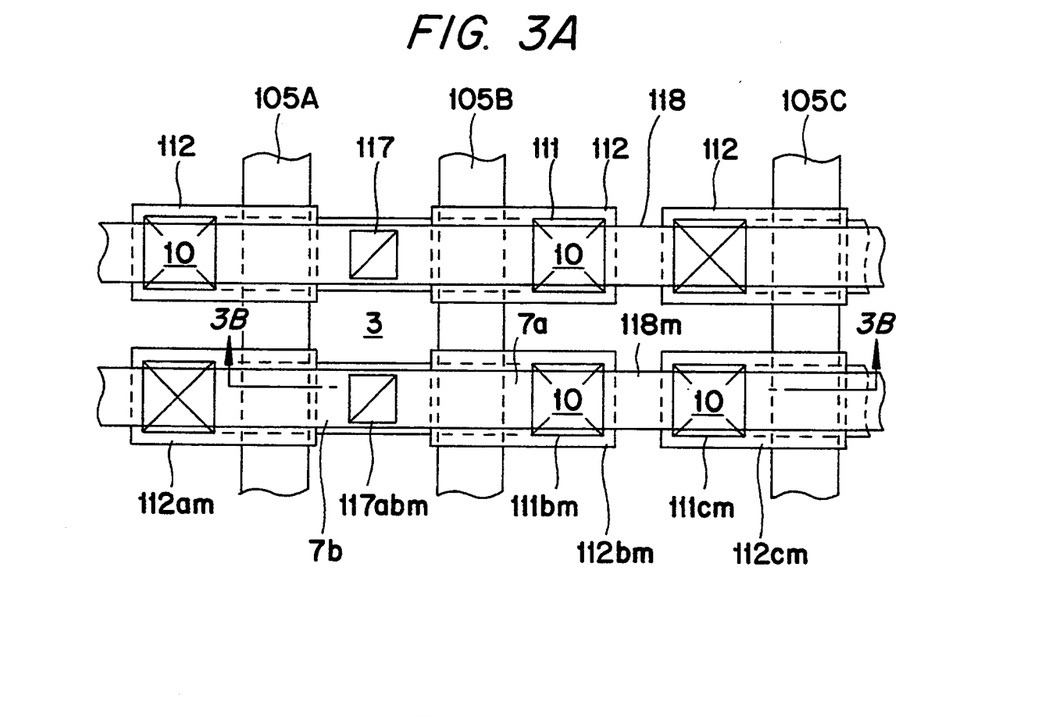
FIG. 3A is a plan view of the second embodiment of the present invention.

Referring to FIG. 3A of a plan of a plurality of DRAM memory cells, and FIG. 3B of a diagram in cross-section taken along line B—B of FIG. 3A, the second embodiment of the present invention will be described under. Each memory cell consists of a MOS transistor and a trench-stacked capacitor. A number of DRAM memory cells are arranged in the open bit line way. An element region is provided at each intersection between word lines 105a, 105b, 105c, etc. and bit lines 118, 118m, etc.

Like the above-described first embodiment, the 0.6 μm feature design rule is used for this DRAM, too. The minimum feature size is 0.4 μm and mask alignment accuracy is 0.05 μm. Lengths of each memory cell parallel to bit and word line are 2.3 μm and 1.2 μm, respectively. It follows that the memory cell space (cell size) amounts to 2.76 μm² which is less that (3.055 μm²) of the first embodiment.

Each element separating region consisting of a p⁺-channel stopper region 2 and a field oxide 3 has a minimum width of 0.6 μm. The minimum width of the element region is 0.6 μm. Word lines 105a, 105b, 105c are made of n⁺ polycrystalline films of 0.2 μm thick and 0.6 μm wide, and the interval between word lines 105a, 105b is 1.1 μm. Bit lines 118, 118m connected through bit contact holes 117, 117m to the first diffused n⁺ layer 13b are 0.5 μm wide, and the interval between bit lines 118, 118m is 0.7 μm. A 0.25 μm-thick silicon oxide film 8a a made of the first insulating film is formed as a spacer on the first diffused n⁻ layer 7a (source region) side of each word line 105a, 105b, 105c. Because of forming trench 10 self-aligned with respect to silicon oxide film 8a a and field oxide film 3, the memory cell space is reduced as described above in this embodiment.

Storage node electrodes 112, 112b m, 112c m connected through node contact holes 111, 111b m, 111c m to the second diffused n⁺ layer 13a are made of a 100 nm-thick n⁺ polycrystalline silicon film and the interval between storage node electrodes is 0.4 μm as the first embodiment.

The second embodiment has more reductive effect on the memory cell space than the first embodiment as mentioned above. In this embodiment, the interval between the second diffused n⁻ layers 7c is at least 0.4 μm with a memory cell drive supply voltage of 3.3 V, and thereby occurrence of punchthrough between the second diffused n⁻ layers 7c defining each trenches 10 is suppressed through the memory cell space reducing effect is somewhat decreased compared with the first embodiment. The second embodiment has the same other effects as the first embodiment does.

Figure 3B:
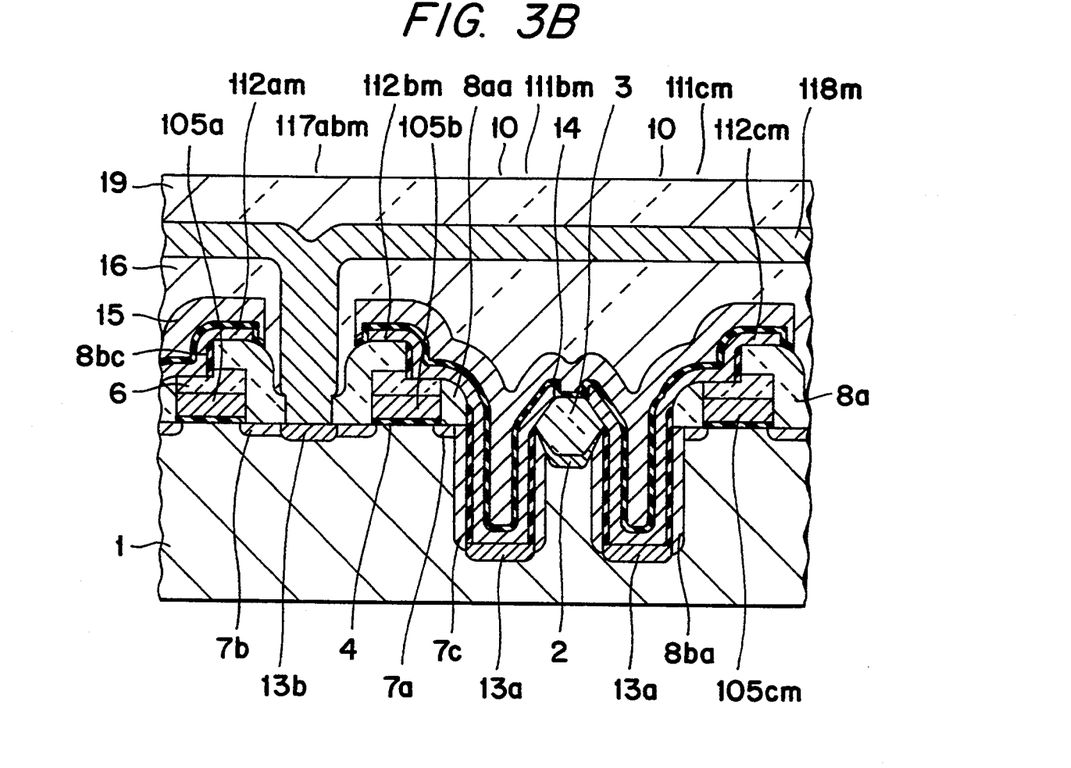
FIG. 3B is a cross-sectional view taken along line B—B of FIG. 3A.
Figure 4A:
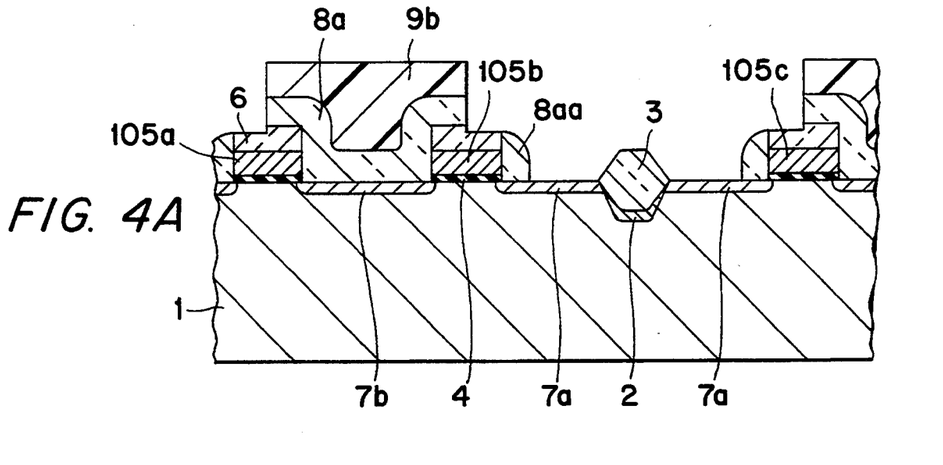
FIGS. 4A to 4C are similar cross-sectional views illustrating the manufacturing process of the second embodiment.
Figure 4B:
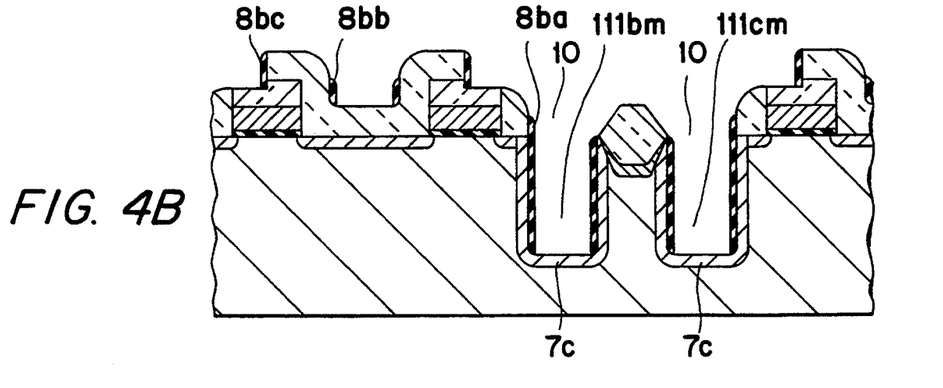
Figure 4C:
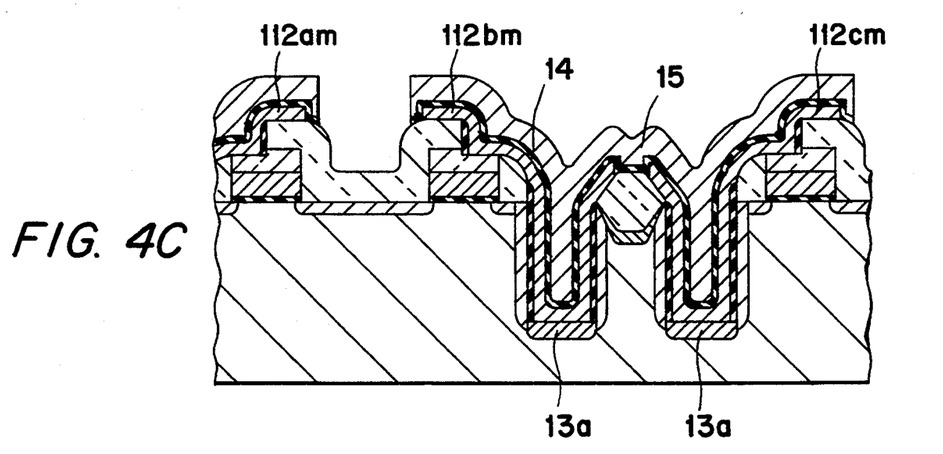

Reference is made to FIGS. 4A to 4C, similar cross-sections to FIG. 3B illustrating the DRAM of the second embodiment. The DRAM memory cells are fabricated as follows.

In the same process as the first embodiment, on the surface of a p-type silicon substrate 1 are formed p⁺-channel stopper regions 2, field oxide film 3 on each, and gate oxide films 4. Then word lines 105a, 105b, 105c, a 0.2 μm thick silicon oxide films 6, and the first diffused n⁻ layers 7a, 7b are formed. Over the resulting whole surface, a 250 μm-thick silicon oxide film 8a is formed. Then a photoresist film 9b is placed which has a pattern well covering the first diffused n⁻ layer 7b. Using photoresist film 9b as mask, silicon oxide film 8a is etched back, leaving silicon oxide films 8a a being formed as spacers on the first diffused n⁻ layer 7a (source region) side of word lines (105a, 105b or 105c) [FIG. 4A]. Simultaneously field oxide 3 is selectively etched.

In the next step, after removing photoresist film 9b, trench 10 penetrating through the first diffused n⁻ layer 7a are etched using field oxide films 3, silicon oxide films 8a a (and silicon oxide films 8a, 6) as masks. Then the second diffused n⁻ layer 7c is formed at the sidewall of each trench 10 in the same way as the first embodiment. Over the entire resulting surface, a 20 to 50 nm-thick silicon oxide film is formed as the second insulating film and etched back by anisotropic dry etching, leaving the portions of silicon oxide film 8b a as spacers each on the sidewall of trench 10. Thereby a node contact hole such as 111, 111b m or 111c m is formed near the bottom of each trench 10. Simultaneously silicon oxide films 8b b, 8b c stay on the inner and outer side faces, respectively, of silicon oxide film 8a [FIGS. 3A, 4B].

In the next step, in the same way as the first embodiment, storage node electrodes 112, 112a m, 112b m, 112c m, etc. made of a 100 nm-thick n+ polycrystalline silicon film, followed by the second diffused n+ layer 13a, are formed. Then dielectric films 14 of 1.5 to 2.0 nm thick, assuming as silicon oxide film, are formed, and thereover 200 nm n+ polycrystalline silicon film as cell plate electrodes 15 are formed [FIGS. 3A and 4C].

In the next step, in the same way as in the first embodiment, a dielectric film 16, and then bit contact holes 117, 17a b m, etc., are formed. Self-aligned with these bit contact holes, the first diffused n+ layer 13b made as of aluminum as bit lines 118, 118m, etc. Thereover a surface protecting film 19 made as of silicon oxide, PSG, silicon nitride, or polyimide film is formed [FIGS. 3A and 3B].

Figure 5A:
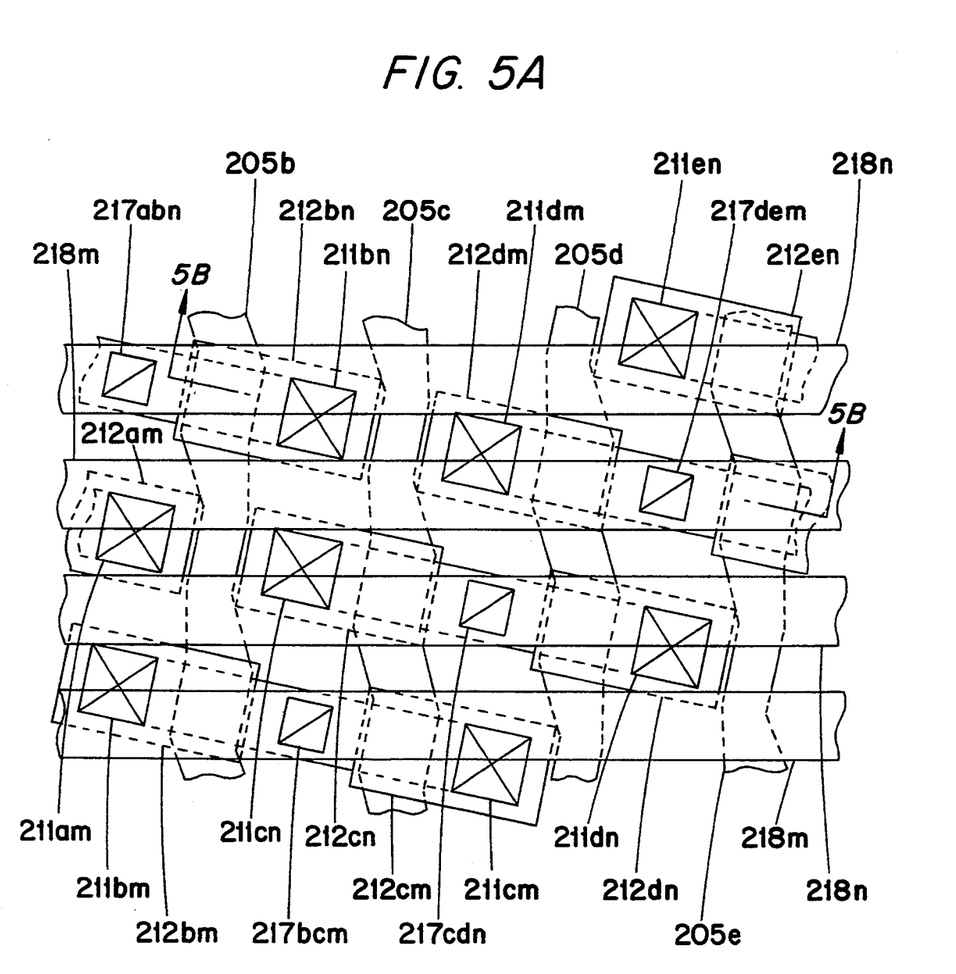
FIG. 5A is a plan view of an example to which the second embodiment is applied.

The first and second embodiments are examples of DRAM which comprises memory cells arranged in the open bit line way, to which the present invention is applied. The present invention can be applied also to a DRAM in which memory cells are arranged in the folded bit line way. One of methods of reducing memory cell space in the DRAM is disclosed in Japanese Laid-Open Patent Application No.Sno.4-65872. In FIG. 5A are shown two pairs of alternately forward and backward bit lines intersecting substantially orthogonally to zigzagged word lines. The element region and the storage node electrode are positioned at a finite angle to the bit lines, with the result of reduced memory cell space. The capacitor is of stacked type.

Figure 5B:
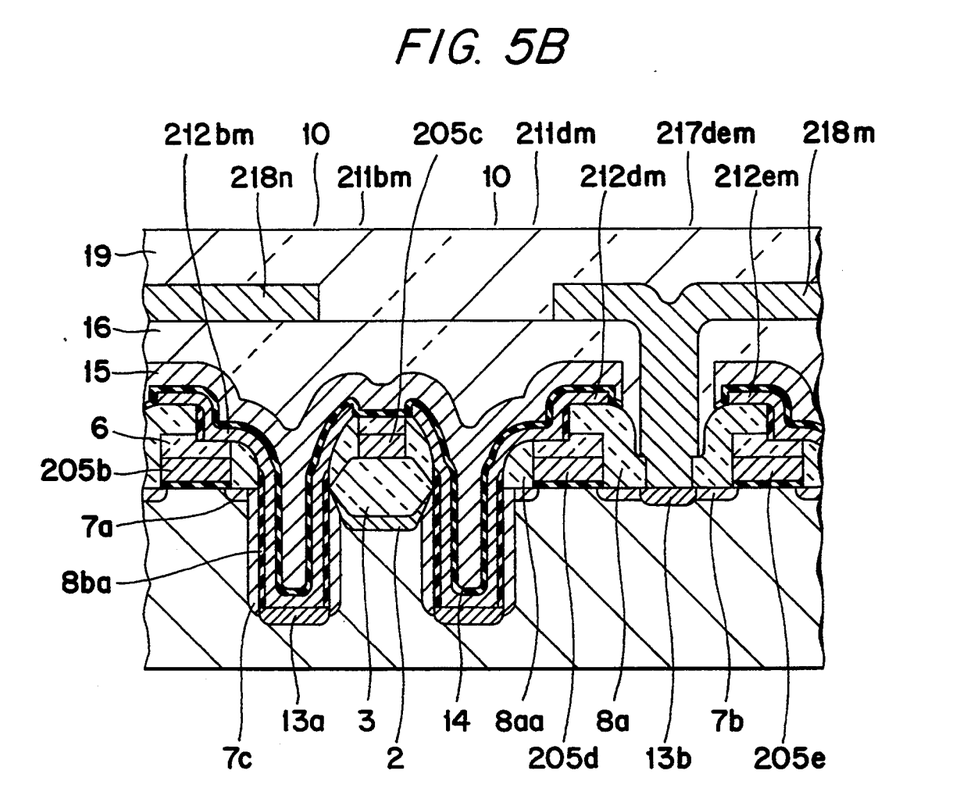
FIGS. 5B is a cross-sectional view taken along line C—C of FIG. 5A.

Referring to FIG. 5A which is a plan of a plurality of DRAM memory cells and FIG. 5B which is a cross-section taken along C—C line of FIG. 5A, an example where the second embodiment is applied to the DRAM described in the last-mentioned Japanese Application, that is, trench-stacked capacitors are used instead.

With 0.6 μm feature design rule, this DRAM is of minimum feature size 0.4 μm and mask alignment accuracy 0.5 μm. Materials and thicknesses of the components are the same as those in the second embodiment. Those different in width, interval and shape from in the second embodiment will be described below.

The element separating region consisting of a p+-channel stopper region 2 and a field oxide film 3 formed on the surface of p-type silicon substrate 1 has a minimum width of 0.7 μm. The minimum width of the element region is 0.6 μm. The gate part of each zigzag word line 205a, 205b, 205c, 205d, 205e is 0.6 μm wide and 0.4 μm in minimum width.

In FIG. 5A are shown one pair of bit lines 218m and one pair of bit lines 218n with one of each pair and one of the other pair arranged alternately. When one pair bit lines 218m is folded back at a right-hand sense amplifier (not shown), the other pair bit lines 218n is folded back at another left-hand sense amplifier (not shown). Each bit line of both pairs is 0.6 μm wide, and the adjacent ones are spaced 0.4 μm from each other. Bit lines 218m, 218n are wider than bit lines in the second embodiment because they can covers fully 0.4 μm square bit contact holes 217a b n, 217b c m, 217d e m, etc. angled to the bit lines. The spacing between adjacent bit lines depends on the minimum width of the element separating region, and simultaneously the spacing between adjacent bit lines 218m, 218n has a limit set by the minimum feature size.

Like the second embodiment, a storage node electrodes 212a m, 212a n, 212b m, 212b n, 212c m, 212c n, 212d m, 212d n, or 212e n are connected to the second diffused n+ layer 13a through a node contact hole 211a m, 211a n, 211b m, 211b n, 211c m, 211c n, 211d m, 211d n, or 211e n formed at the bottom of the trench 10. The minimum spacing between adjacent storage node electrodes is 0.4 μm.

This example has the effects of the second embodiment over the case where the conventional type of trench-stacked capacitor is used instead of the capacitor type applied to the DRAM described in the last-mentioned patent specification.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor memory device including a plurality of memory cells formed in a semiconductor substrate of a first conductivity type, each of said memory cells comprising a transistor and a capacitor connected to said transistor; said transistor including first and second regions of a second conductivity type selectively formed in said semiconductor substrate to define a channel region of said transistor therebetween, said second conductivity type being opposite to said first conductivity type; said capacitor including a trench selectively formed in said semiconductor, said trench having a side surface and a bottom surface, a third region of said second conductivity type formed in said semiconductor substrate along said side and bottom surfaces of said trench in contact with said first region of said transistor, an insulating film formed on said side and bottom surfaces of said trench, a hole formed in a part of said insulating film to expose a part of said third region, a first conductive layer formed in contact with said part of said third region through said hole and extended over said insulating film, said third region and said first conductive layer serving as a first electrode of said capacitor, a dielectric film formed on said first conductive layer, and a second conductive layer formed on said dielectric film and serving as a second electrode of said capacitor.

2. The memory device as claimed in claim 1, wherein said third region comprises a high-impurity concentration region formed in said semiconductor substrate at said bottom surface of said trench and a low-impurity-concentration region formed in said semiconductor substrate at said side surface of said trench in contact with said first region, said hole being formed in a portion of said insulating film covering said bottom surface of said trench to thereby expose said high-impurity-concentration region, and said first conductive layer being connected to said high-impurity-concentration region through said hole.

3. The memory device as claimed in claim 1, wherein said transistor further includes a gate electrode formed on a gate insulating film covering said channel region and an insulating layer covering said first region and said gate electrode, said first conductive layer being elongated over said insulating layer to provide a first elongated portion, said dielectric film being elongated over said first elongated portion of said first conductive film to provide a second elongated portion, and said second electrode being elongated over said second elongated portion of said dielectric film.

* * * * *